United States Patent [19]

Noguchi

[11] Patent Number: 4,654,848
[45] Date of Patent: Mar. 31, 1987

[54] MULTI-TRIGGER LOGIC ANALYZER

[75] Inventor: Kazuo Noguchi, Kumagaya, Japan

[73] Assignee: Takeda Riken Kogyo Kabushikikaisha, Tokyo, Japan

[21] Appl. No.: 719,154

[22] Filed: Apr. 2, 1985

[30] Foreign Application Priority Data

Apr. 6, 1984 [JP] Japan .................................. 59-69727

[51] Int. Cl.$^4$ ............................................. G06F 11/00
[52] U.S. Cl. ...................................... 371/20; 371/15; 371/25; 324/73 R
[58] Field of Search ...................................... 371/15–16, 371/20–21, 24–26, 29, 67; 324/73 R, 73 AT, 73 PC

[56] References Cited

U.S. PATENT DOCUMENTS

| | | | |
|---|---|---|---|
| 4,287,594 | 1/1981 | Shirasaka | 371/25 |
| 4,313,200 | 1/1982 | Nishiura | 371/25 |
| 4,365,334 | 12/1982 | Smith et al. | 324/73 R X |
| 4,425,643 | 1/1984 | Chapman et al. | 371/20 |
| 4,434,488 | 2/1984 | Palmquist et al. | 371/15 |
| 4,481,627 | 11/1984 | Beauchesne et al. | 371/21 |
| 4,497,056 | 1/1985 | Sugamori | 371/25 |
| 4,551,838 | 11/1985 | Gannett | 371/25 |

Primary Examiner—Gary V. Harkcom

Attorney, Agent, or Firm—Staas & Halsey

[57] ABSTRACT

Logic data (input data) is sequentially supplied to a data memory using sampling pulses and the input data is written into the data memory at an address specified by an address signal from an address counter which advances by one upon each occurrence of the sampling pulse. The input data and an output trigger word from a trigger word register are compared by a trigger word detector, and when coincidence is detected therebetween, a coincidence signal is generated, which signal is delayed by a delay circuit by a value corresponding to output delay data from a delay register. The delayed output is provided as a stop signal. By the stop signal the address counter is preset to a leading address of a storage area of the data memory into which data is to be stored and the next trigger word is provided from the trigger register. Further, the next delay data is provided from a delay register and the next store number is output from a store-number register. The sampling pulses are counted by a store-number counter, and when the count value coincides with the output store number from the store-number register before the stop signal is generated, the address counter is preset to the leading address of the storage area of the data memory into which data is being written at that time.

9 Claims, 18 Drawing Figures

MULTI-TRIGGER LOGIC ANALYZER

BACKGROUND OF THE INVENTION

The present invention relates to a logic analyzer for analyzing logic data from a logic circuit including a microprocessor.

For developing, manufacturing or troubleshooting complex digital electronic apparatus having incorporated thereinto, for example, a microprocessor, logic measurement instruments are necessary which makes it possible to observe the state of input and output logic data of respective parts and logic data such as a program for operating the apparatus. One logic measurement instrument is a logic analyzer. The logic analyzer of this kind is disclosed, for instance, in "Hewlett-Packard Journal" (pp. 2-9, January 1974) and U.S. Pat. Nos. 4,425,643 (issued on Jan. 10, 1984) and 4,434,488 (issued on Feb. 28, 1984). In this logic analyzer, input logic data is stored in a data memory and the stored data is displayed on a CRT display or the like for effecting program analyses such as a state analysis and a timing analysis of the input logic data. As compared with other logic measurement instruments, the logic analyzer is a very useful and versatile measurement instrument because it can detect a desired word (referred to as a trigger word) from the input digital data and can measure a desired portion of the input digital data on the basis of the desired word.

To facilitate a better understanding of the present invention, a description will be given first, with reference to FIGS. 1 and 2A to 2F, of a conventional logic analyzer. Input digital data, which consists of a plurality of parallel bits, is applied from a data acquisition probe 10 to a level converter 11, wherein its level is compared with a reference level and converted to a logic level suitable for handling in the logic analyzer. The input digital data from the level converter 11 is applied to a temporary memory 12. A sampling pulse generator 14 applies sampling pulses 101 to the temporary memory 12 and the input digital data (hereinafter referred to simply as the input data) is input in the temporary memory 12 at the timing of the sampling pulse and held there until the next sampling pulse is applied.

Figure 1:
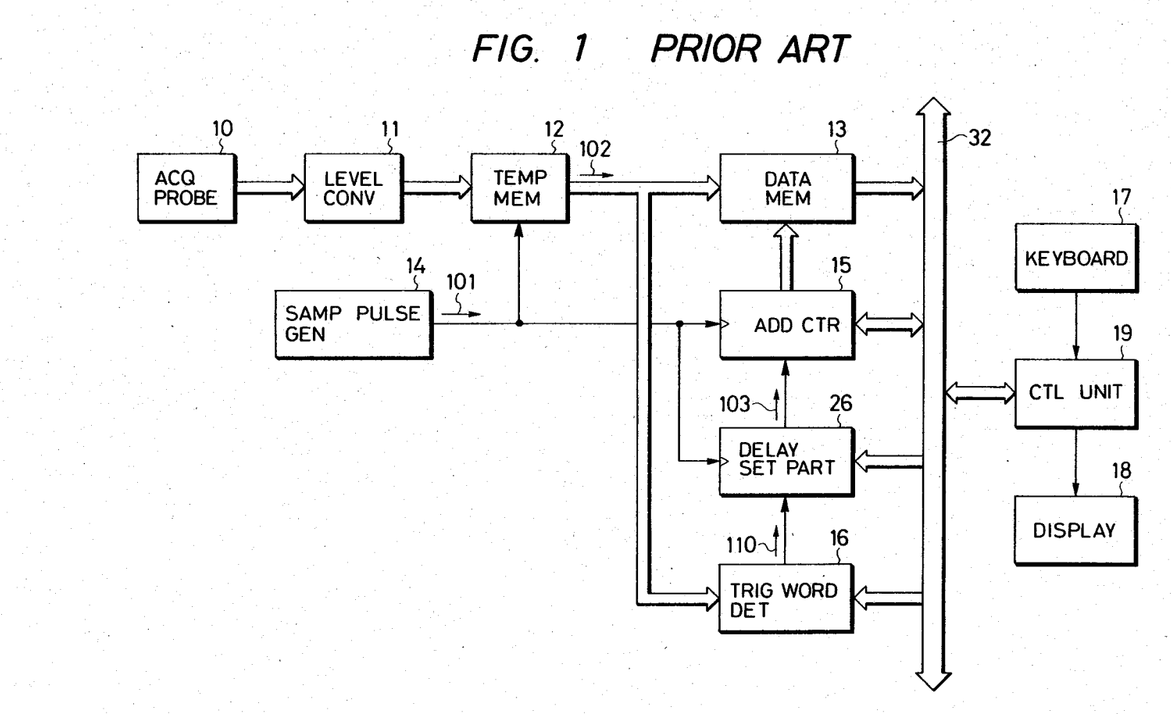
FIG. 1 is a block diagram showing a conventional logic analyzer.
Figure 2A:
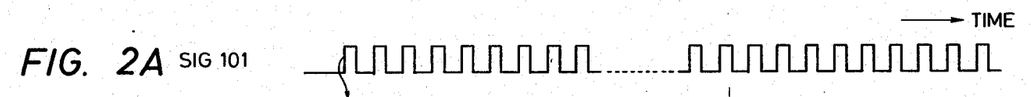
FIGS. 2A to 2F are diagrams showing a timing chart explanatory of the operation of the logic analyzer depicted in FIG. 1 and the contents of a data memory 13 used therein.
Figure 2B:
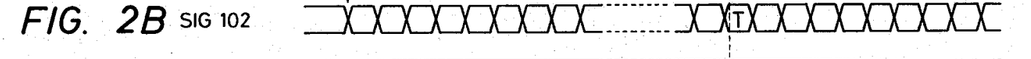
Figure 2C:
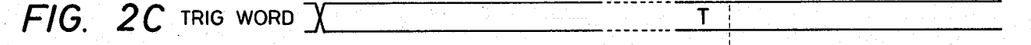
Figure 2D:
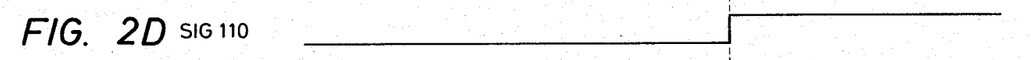
Figure 2E:
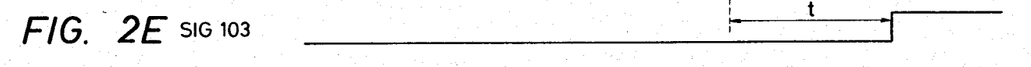
Figure 2F:
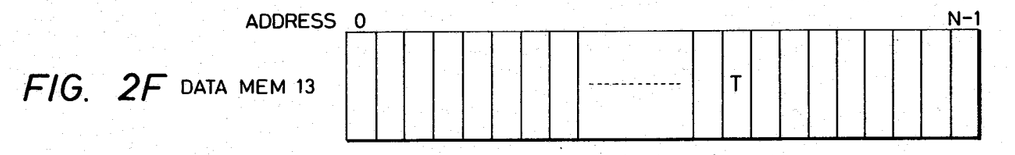

The sampling pulse 101, for example, in the case of a state analysis, is generated by the sampling pulse generator 14 based on a clock signal which is applied from a logic circuit under test, such as an electronic apparatus, and in the case of a timing analysis, clock signals are used which are generated, by a clock signal generator built in the logic analyzer, at a higher rate than the repetition rate of the input data and at regular intervals.

The data held in the temporary memory 12 is applied to a data memory 13 and a trigger word detecting part 16. The data memory 13 loads thereinto the data from the temporary memory 12 at an address specified by an address signal from an address counter 15. The address counter 15 is supplied with the sampling pulses 101 from the sampling pulse generator 14 and advances by one step upon each application of the sampling pulse 101. The count output of the address counter 15 is applied as the address signal to the data memory 13.

The trigger word detecting part 16 is given a predetermined trigger word in advance, and it compares the trigger word with the data from the temporary memory 12 and, in the case of coincidence, applies a coincidence signal 110 to a delay setting part 26 which serves as a delay means. Supplied with the coincidence signal 110, the delay setting part 26 starts to count the sampling clocks 101 and generates a stop signal 103 when it counts a preset number of pulses. That is, the stop signal 103 is generated a certain period of time after the generation of the coincidence signal 110 and the signal 103 is applied to the address counter 15. As a result of this, the step-by-step operation of the address counter 15 stops, bringing the input data loading operation of the data memory 13 to an end. In other words, when a predetermined number of data are loaded into the data memory 13 after appearance of the trigger word in the input data, the loading operation is stopped.

Based on an instruction from a control unit 19 which is formed by a microcomputer, the data thus loaded into the data memory 13 is provided via an interface bus 32 to the control unit 19, wherein the data is read out over a desired range on the basis of the trigger word, thereafter being displayed on a display 18. More specifically, the address counter 15 is controlled by the control unit 19 to generate an address signal necessary for readout of the data memory 13. The data read out of the data memory 13 by the address signal is transferred via the interface bus 32 to the control unit 19, wherein the transferred data is converted into various display formats necessary for a logic analysis and then displayed on the display 18.

The control unit 19 exerts control over the entire operation of the logic analyzer, that is, it controls the readout of data from the data memory 13 and the display format as mentioned above and, at the start of measurement, controls the application of a trigger word specified through a keyboard 17 to a register in the trigger word detecting part 16 via the bus 32 and the setting in the delay setting part 26 of a number corresponding to a required delay time so as to determine how many times data is to be acquired prior to the generation of the stop signal after the detection of the trigger word from the sampled data.

FIGS. 2A to 2F show a timing chart for explaining the input data acquiring operation and the stored contents of the data memory 13 in the conventional logic analyzer shown in FIG. 1. By repetitive generation of the sampling pulse 101 the data 102 held in the temporary memory 12 is loaded into the data memory 13 and, at the same time, new input data is sampled and held in the temporary memory 12. The data memory 13 has, for example, 1024 words and writes therein the data 102 starting at an address 0 until the stop signal is applied thereto from the delay setting part 26. When the stop signal 103 is not applied after the data is written at an address 1023, the write returns to the address 0. That is, the data 102 is continuously written into the data memory 13 until the stop signal 103 is generated, and the old contents of the data memory 13 are renewed by the up-to-date data.

In this example, it is assumed that the trigger word T is applied to the trigger word detecting part 16 prior to measurement. The data 102 is loaded by the sampling pulses 101 into the data memory 13 at respective addresses one after another, and when a word that appears in the data 102 coincides with the word T, the trigger word detecting part 16 detects the coincidence, and yields a coincidence signal 110, and after the lapse of time t the delay setting part 26 generates the stop signal 103. The stop signal stops the step-by-step operation of the address counter 15, after which the data memory 13 is not accessed.

In this way, the data continuously loaded into the data memory 13 is provided, under control of the control unit 19, via the interface bus 32 to the control unit 19, wherein a required portion of the data is read out on the basis of the trigger word T, and the read-out data is converted into a display format suitable for a logic analysis, thereafter being displayed on the display 18.

As described above, the prior art logic analyzer specifies one trigger word and performs storage and display of the input data on the basis of the trigger word. Therefore, the utilization efficiency of the data memory 13 is low, and when it is desired to carry out a logic analysis using a plurality of trigger words, it is necessary to set the trigger words one by one and to repeat measurement. Accordingly, the conventional logic analyzer requires much time for the logic analysis and encounters difficulty in conducting a complex logic analysis.

SUMMARY OF THE INVENTION

It is therefore an object of the present invention to provide a logic analyzer in which predetermined numbers of input data can be loaded into one data memory and read out therefrom respectively based on a plurality of trigger words and which therefore improves utilization efficiency of the data memory, reduces the logic analyzing time and enables a complex logic analysis.

According to the present invention, the data memory in the logic analyzer is divided into a desired number of areas so that a desired number of input data can each be loaded into one of the divided storage areas on the basis of one trigger word.

To perform this, the number of data (the number of words) that can be stored in each storage area of the divided data memory is preset in a store number setting part. Sampling pulses are counted by a store number counter, and when its count value reaches the store number (the number of data) being output from the store number setting part, the store number counter generates a count-up signal and the input data loading operation is continuously performed starting at a first address of the storage area. When a stop signal is generated by a delay setting part prior to the generation of the count-up signal, the input data loading operation is carried out starting at the first address of the next storage area. An address control circuit is provided for this operation. The address control circuit holds the leading address of the storage area into which the input data is being written. When supplied with the stop signal from the delay setting part, the address control circuit adds the output store number of the store number setting part to the leading address held so far so as to prepare the leading address of the storage area into which input data is to be written next. The address control circuit holds the newly prepared leading address and presets it in the address counter. When the store number counter generates the count-up signal, the leading address held in the address control circuit is preset by the count-up signal into the address counter. Upon each occurrence of the stop signal from the delay setting part, a trigger word corresponding to the next storage area is selected (specified) in a trigger word register and output therefrom.

Because of such an arrangement, the trigger word corresponding to each of the plurality of divided storage areas is loaded into the trigger word register and one of the trigger words is specified and output. Addresses of the storage area corresponding to the trigger word being output are sequentially specified until the same word as the trigger word is detected in the input data and the stop signal is produced by the delay setting part. Upon generation of the stop signal, addressing shifts to the next storage area to specify its addresses in a sequential order, storing therein input data and detecting coincidence between the input data and the trigger word specified next. With such an arrangement and operation, it is possible to store predetermined amounts of input data in the respective storage areas of the data memory individually based on the plurality of trigger words without the necessity of increasing the overall storage capacity of the data memory. Accordingly, for instance, in the case where logic data desired to be measured is very long and contains something noteworthy at several places, required data can be obtained, in one measurement, by specifying them with trigger words according to the logic analyzer of the present invention.

DESCRIPTION OF THE PREFERRED EMBODIMENTS

Figure 3:
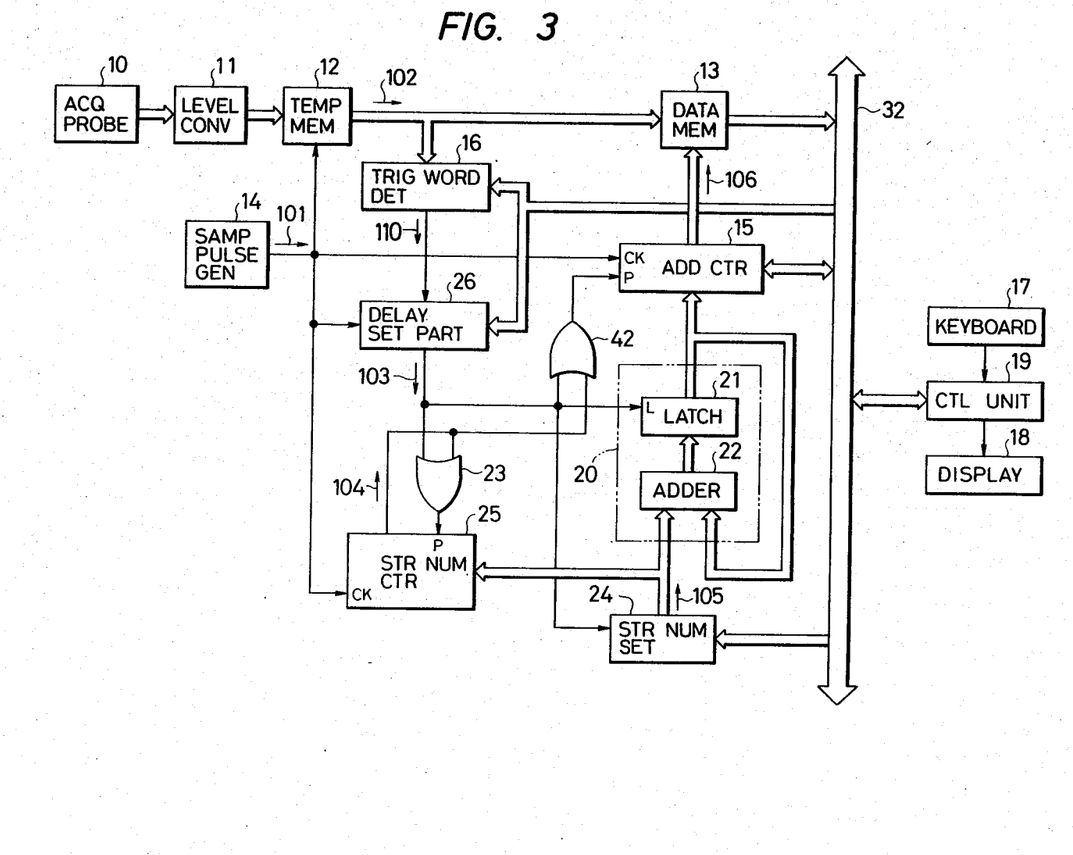
FIG. 3 is a block diagram illustrating an embodiment of the logic analyzer of the present invention.

FIG. 3 illustrates in block form an embodiment of the logic analyzer of the present invention, in which like parts corresponding to those in FIG. 1 are identified by the same reference numerals.

Prior to the start of measurement, the number of data or the store number (the number of words) that can be stored in each storage area of the divided data memory 13 is loaded by the control unit 19 into a store-number setting part 24. Similarly, a trigger word corresponding to each storage area is set in the trigger word detecting part 16, and further, delay data indicating the delay time of the delay setting part 26 is set corresponding to each storage area. The number of storage areas, the store number (the number of data) in each storage area, the trigger words and the delay data can be set to desired values by entering measurement conditions into the control unit 19 through the keyboard 17.

The store numbers which are set in the store number setting part 24 and selectively output therefrom are each applied to a store-number counter 25 and an address control circuit 20. The sampling pulses 101 are applied to the store-number counter 25 for counting, and when the count value reaches the store number applied from the store-number setting part 24, the store number counter 25 generates a count-up signal 104. Upon generation of the count-up signal 104, the store-number counter 25 restarts the counting of the sampling pulses from its initial state, and at the same time, the leading address held in the address control circuit is set, by the count-up signal 104, in the address counter 15. When the delay setting part 26 generates a stop signal, the store number of the next storage area of the data memory 13 is provided to the store-number counter 25 from the store-number setting part 24 and the leading address of the next storage area is produced by the address control circuit 20 and set in the address counter 15.

The address control circuit 20 is formed by a latch circuit 21 and an adder 22 in this example. In the latch circuit 21 is held the leading address corresponding to the storage area into which data is being written, and the leading address is applied to the address counter 15. Supplied with the leading address, the address counter 15 advances by one step upon each occurrence of the sampling pulse, accessing the data memory 13. The leading address held in the latch circuit 21 is fed back to the adder 22, wherein it is added to the store number applied from the setting part 24. The added address is latched, as the leading address corresponding to the next storage area, in the latch circuit 21 when the stop signal is applied thereto from the delay counter 31.

Figure 4:
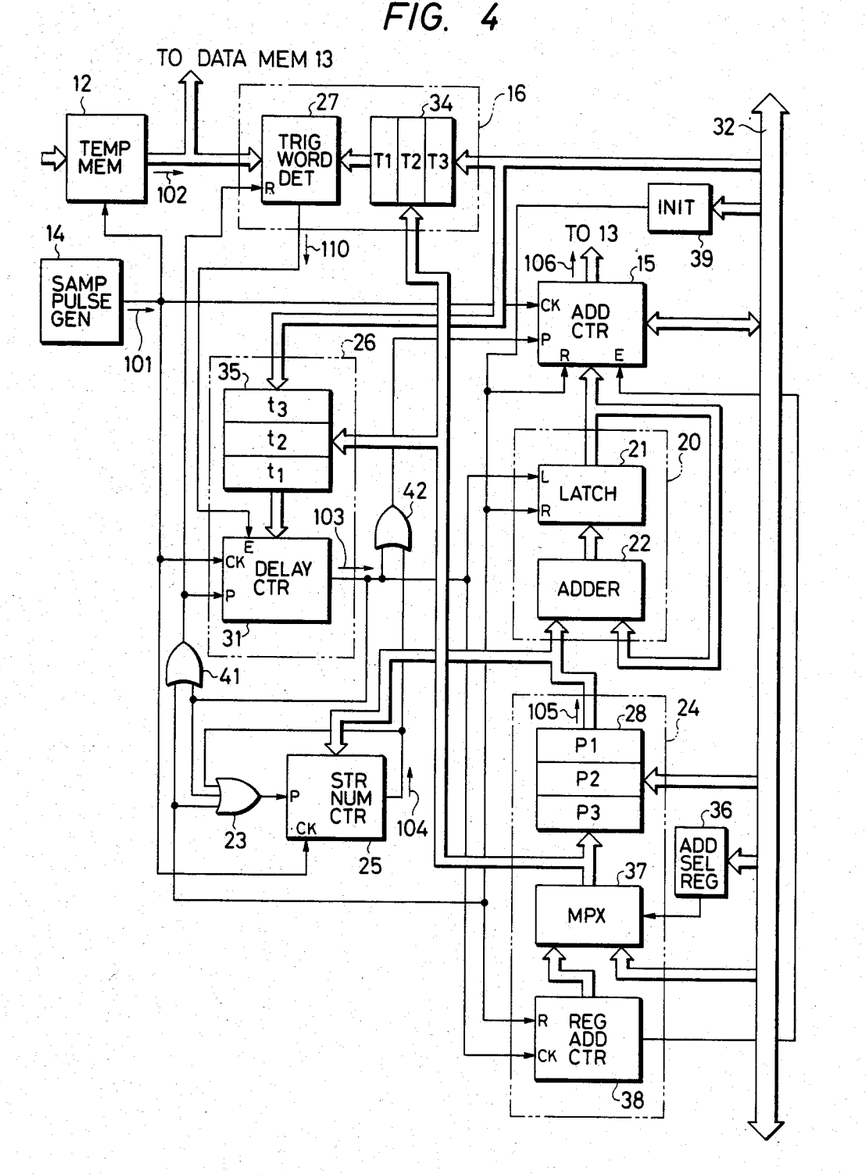
FIG. 4 is a block diagram illustrating a specific operative example of the principal parts of the embodiment shown in FIG. 3.
Figure 5A:
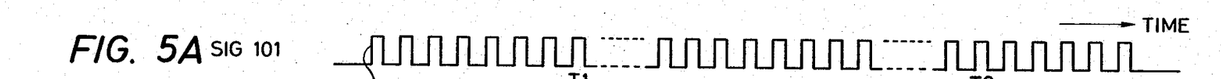
FIGS. 5a to 5i are timing charts for explaining the operation of the embodiment and the contents of the data memory 13 employed therein.
Figures 5B, 5C, 5D:
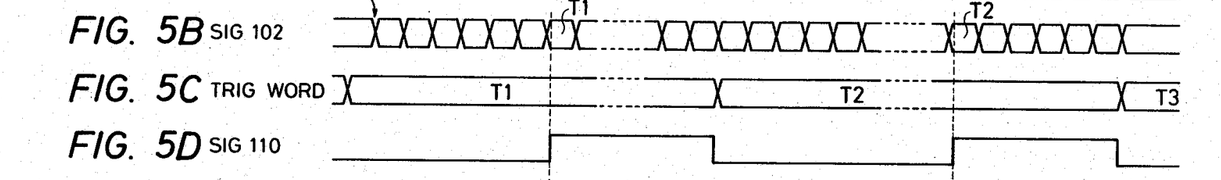
Figure 5E:
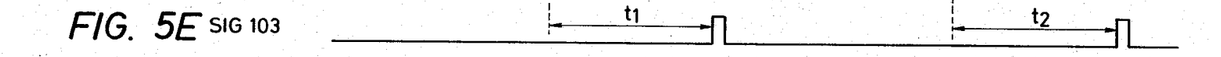
Figure 5F:
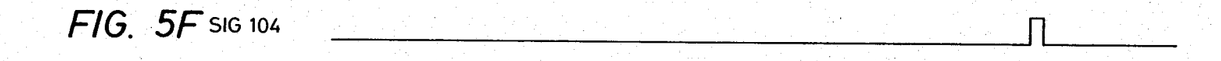
Figure 5G:
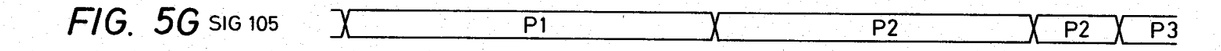
Figures 5H, 5I:
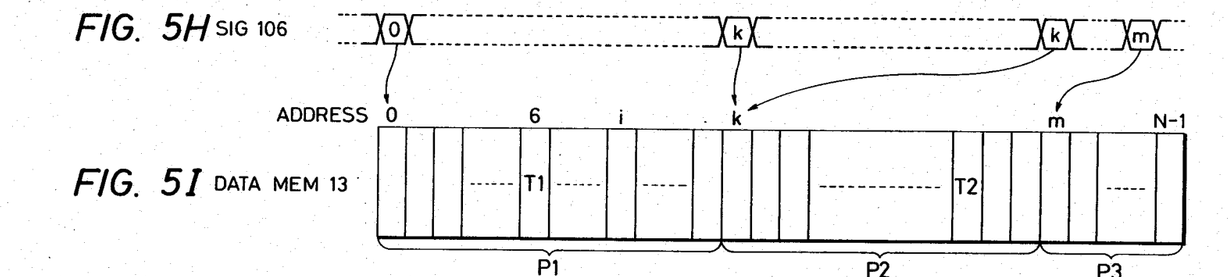

Next, a description will be given, with reference to FIG. 4, of a specific operative example of each part of the logic analyzer shown in FIG. 3 though those parts 10, 11, 13, 17, 18, 19 are not shown. The trigger word detecting part 16 comprises a trigger word detector 27 and a trigger word register 34, and the delay setting part 26 comprises a delay counter 31 and a delay register 35. The store-number setting part 24 comprises a store-number register 28 and a register address counter 38. The store-number register 28, the trigger word register 34 and the delay register 35 are each formed by a read-/write memory (RAM). Prior to commencement of the measuring operation, the control unit 19 controls an address select register 36 via the interface bus 32 and, based on the output from the address select register 36, a multiplexer 37 selects the address of the interface bus 32. Accordingly, the registers 28, 34 and 35 can be addressed by the control unit 19 via the interface bus 32. Then, the store numbers or the numbers of data that can be stored in the respective storage areas of the data memory 13, trigger words on the basis of which data are stored in the respective storage areas, and delay data each of which indicates a delay time from the generation of a coincidence signal to the generation of a stop signal in each storage area are respectively stored in the store-number register 28, the trigger word register 34 and the delay register 35 from the control unit 19 via the interface bus 32. During measurement the multiplexer 37 selects a register address which is applied thereto from the address select register 36 in response to its setting by the control unit 19. Specified by the register address, one store number is read out of the store-number register 28 and applied to the store-number counter 25. One trigger word is read out of the trigger word register 34 and applied to the trigger word detector 27, and one delay data is read out of the delay register 35 and applied to the delay counter 31.

At the start of measurement the multiplexer 37 is set to select the output of the register address counter 38 and an initialization circuit 39 is controlled by the control unit 19 via the interface bus 32 to generate an initializing pulse. The initializing pulse is applied to the address counter 15, the latch circuit 21 and the register address counter 38 to reset them to zero. Further, the initializing pulse is provided via an OR circuit 23 to the store-number counter 25 to preset therein the store number output from the store-number register 28 at that time. The initializing pulse is further applied via an OR circuit 41 to the trigger word detector 27 to reset it and to the delay counter 31 to preset therein the output delay data from the delay register 35. In this initialization the register address counter 38 is reset and after the store-number register 28 and the delay register 35 are read out by the output address from the register address counter 38, the store-number counter 25 and the delay counter 31 are preset.

Next, a description will be given, also with reference to FIG. 5, of the operation of the embodiment illustrated in FIG. 4. FIG. 5 shows the case where the data memory 13 is divided into three storage areas which start at addresses 0, k and m, respectively. Let it be assumed that the numbers of data (store numbers) that can be stored in the three storage areas are set to P1, P2 and P3, respectively, as shown. The trigger words corresponding to the three storage areas are identified by $T_1$, $T_2$ and $T_3$, respectively. Further, let it be assumed that the delay times from the detection of the same words in the input data as the trigger words by the trigger word detector 27 to the generation of the stop signal by the delay counter 31 are set to $t_1$, $t_2$ and $t_3$, respectively. The delay time until the generation of the stop signal is dependent upon how many words of data are desired to store before, after, or before and after the trigger word in the input data.

The store numbers P1, P2 and P3, the trigger words $T_1$, $T_2$ and $T_3$ and delay data (also identified by $t_1$, $t_2$ and $t_3$) indicating the delay times $t_1$, $t_2$ and $t_3$ are respectively set by the control unit 19 in the store-number register 28, the trigger word register 34 and the delay register 35 prior to the start of measurement.

Accordingly, at the start of measurement, the store number P1, the trigger word $T_1$ and the delay data $t_1$ are being output from the store-number register 28, the trigger word register 34 and the delay register 35, respectively. Upon application of the sampling pulse 101 from the sampling pulse generator 14, the temporary memory 12 samples and applies the input data 102 to the data memory 13 and the trigger word detector 27. The address counter 15 supplies the data memory 13 with an address signal which starts at an address 0 and advances by one upon each occurrence of the sampling pulse 101. The store-number counter 25 has preset therein the store number P1 of a first storage area, and it counts down the sampling pulses 101. Having counted the sampling pulses 101 by the store number P1, the store-number counter 25 generates the count-up signal 104, which is fed via the OR circuit 23 back to a preset terminal of the store-number counter 25 to preset therein the store number P1 again. FIG. 5 shows the case where during the operation of writing input data into the storage area which starts at the address 0 the stop signal 103 is generated by the delay counter 31 before the count-up signal 104 is yielded by the store-number counter 25, and the input data writing operation shifts to the next storage area (which starts at the address k).

More specifically, the input data 102 from the temporary memory 12 are sequentially loaded into the storage area of the data memory 13 that starts at the address 0 while being compared with the output trigger word $T_1$ from the trigger word register 34 in the trigger word detector 27. When the trigger word $T_1$ is detected from the input data 102, the coincidence signal 110 is yielded from the trigger word detector 27 and applied to the delay counter 31, starting to count down the sampling pulses 101. The delay counter 31 has preset therein the delay data $t_1$ by initialization. Having counted the sampling pulses 101 for the time $t_1$, the delay counter 31 generates the stop signal 103. Accordingly, when $t_1$ input data are loaded into the data memory 13 after the detection of the trigger word $T_1$, the delay counter 31 produces the stop signal 103. In this example, the trigger word $T_1$ is stored at an address 6 of the data memory 13 and then the subsequent input data are loaded to the respective addresses up to an address i, after which the stop signal 103 is generated. The stop signal 103 is supplied to the trigger word detector 27 to reset it. The stop signal 103 is also supplied to the latch circuit 21 to latch therein the result of an addition from the adder 22 obtained by adding the store number P1 from the store-number register 28 and 0 of the latch circuit 21. Although no particular delay circuit is shown, the stop signal 103 is applied via an OR circuit 42 to the address counter 15 to preset therein the value P1 held in the latch circuit 21 immediately after the abovesaid latching. This store number P1 is used as the leading address of the next storage area which starts at the address k. The register address counter 38 is advanced by one step by the stop signal 103. Consequently, the store number P2, the trigger word $T_2$ and the delay data $t_2$ are respectively provided from the store-number register 28, the trigger word register 34 and the delay register 35. Immediately after this, the stop signal 103 is provided via the OR circuit 23 to the store-number counter 25 and via the OR circuit 41 to the delay counter 31 to preset the store number P2 in the former and the delay data $t_2$ in the latter, though no delay circuit for timing adjustment is shown.

In this state, upon each occurrence of the sampling pulse 101, the address signal 106 from the address counter 15 advances by one step and the input data is sequentially loaded into the second storage area of the data memory 13 starting at the address k (where k=P1). The store-number counter 25 subtracts one from the store number P2 upon each occurrence of the sampling pulse 101. The trigger word detector 27 compares the trigger word $T_2$ with the input data.

When the word $T_2$ is detected by the trigger word detector 27 from the input data 102, the coincidence signal 110 is generated and the delay counter 31 counts down the sampling pulses 101 from its preset value $t_2$. In this example, however, counting by the store-number counter 25 happens to reach the store number P2 before the delay counter 31 goes down to zero and generates the stop signal 103, that is, the count value of the store-number counter 25 goes down to zero and the counter 25 provides the count-up signal 104. That is, until a predetermined number of data are loaded (before the time $t_2$ elapses) after detection of the trigger word $T_2$, data loading for all addresses up to (m−1) of the second storage area is completed. Therefore, the store number P2 is preset again in the store-number counter 25 and the count-up signal 104 is applied via the OR circuit 42 to the address counter 15, in which the address k having been latched in the latch circuit 21 is preset again as the leading address. As a result of this, the address signal from the address counter 15 advances one by one from the address k, accessing the data memory 13. That is, until the stop signal 103 is generated from the delay counter 31, the addresses of the second storage area at which data have been already written are rewritten with new data.

The write operation is thus continued and when the stop signal 103 is generated by the delay counter 31, the register address counter 38 advances by one and the latch circuit 21 in the address control circuit 20 latches the leading address of the third storage area and presets its value in the address counter 15. In other words, before the generation of the stop signal 103, the store number P2 has been applied to the adder 22 from the store-number register 28 and the store number P1 latched in the latch circuit 21 has been fed back to the adder 22. Accordingly, the output of the adder 22 is the sum of the store numbers P1 and P2, i.e. P1+P2=m, which is applied to the latch circuit 21. When supplied with the stop signal 103, the latch circuit 21 latches the sum m of the store numbers P1 and P2, and in the same manner as described previously, the sum m is preset in the address counter 15 and used as the leading address of the third storage area of the data memory 13.

Further, based on the stop signal 103, the store number P3 of the third storage area from the store-number register 28 is preset in the store-number counter 25 and the delay data $t_3$ from the delay register 35 is preset in the delay counter 31 as in the above. The trigger word $T_3$ is applied from the trigger word register 34 to the trigger word detector 27 to cause it to perform the detecting operation for the trigger word $T_3$. In consequence, the input data are sequentially loaded into the third storage area starting at the address m in response to the application of the sampling pulses and, when the stop signal 103 is generated by the delay counter 31, the data loading operation is stopped as described above.

When a stop signal 103 is generated during the loading of data into the final storage area of the data memory 13, the register address counter 38 reaches a predetermined value corresponding to the number of the storage areas and produces a high level output, which is supplied to the address counter 15 to disable it, thereby completing the data loading operation of the logic analyzer.

As described above, according to the present invention, the single data memory 13 can be separated into a desired number of areas for storing desired numbers of data respectively, and only required amounts of input data can be loaded into the respective storage areas based on predetermined different words. Accordingly, even if unnecessary data exist in large quantities, for example, between the required data loaded on the basis of the trigger word $T_1$ and the required data loaded on the basis of the trigger word $T_2$, these unnecessary data are not loaded into and held in the data memory 13. This raises the utilization efficiency of the data memory 13 and makes it possible to conduct in a short time such a complex logic analysis that includes a plurality of data words for data acquisition.

Ordinary logic analyzers have a large-capacity data memory of, for instance, 1K words, but in practice, not so many logic analyses call for such a vast amount of data and data of several tens of words before and after a trigger word to be noted is enough in many cases. On the contrary, there are many cases where it is desired to load input dfata on the basis of each of several kinds of data words attracting attention. In such cases, according to the prior art ogic analyzers, since it is necessary to set a trigger word for each data word and to conduct measurement a plurality of times, the logic analysis inevitably involves complicated operations and consumes much time. In contrast thereto, the logic analyzer of the present invention obviates such disadvantages and permits short-time loading of the input data on the basis of plural trigger words, and hence it makes it possible to conduct a complex logic analysis with high efficiency.

In the above, different store numbers P1, P2 and p3 and different delay times t₁, t₂ and t₃ are set corresponding to the trigger words, respectively. The reason for this is as follows: In general, the number of data necessary for an analysis differs with the trigger word, and there are many cases where the delay time also differs with the trigger word as in the case where it is desired to know data mainly before, after, or before and after the trigger word. In some cases, however, it is also the same value and hence load the single store number in the store-number register 24. According to the purpose of use, the delay time may also be fixed.

While in the above the next trigger word is determined by the use of the register address counter 38, it is also possible to employ an arrangement in which, for example, such a sequencer as the Microprogram Sequencer AM2911 by Advanced Micro Devices Inc. of the United States is used to determine which trigger word is to be used next and the trigger word is applied from the trigger register 34 to the trigger word detector 27. With this arrangement, the trigger words can be output in a complex fashion, for example, the same trigger word can be output repeatedly or a plurality of trigger words can be output continuously and repeatedly, by which it is possible to conduct a complex analysis. Also in this case, the triggers are selectively output and, as required, the corresponding store number and delay data are also selectively provided.

The store-number counter 25 and the delay counter 31 need only to detect their counting of the store number and the delay data (time), respectively. Accordingly, for instance, an up counter can be used as the store-number counter 25, and in this case, a value obtained by subtracting the store number from its maximum count value is preset in the store-number counter and an overflow therefrom is employed as the count-up signal 104. Alternatively, the count value of the up counter used as the store-number counter 24 is compared with the output store number of the store-number register 28, and when coincidence is detected, the count-up signal 104 is generated. This applies to the delay counter 31 as well.

It will be apparent that many modifications and variations may be effected without departing from the scope of the novel concepts of the present invention.

What is claimed is:

1. A logic analyzer comprising:
    a sampling pulse generator for outputting a sampling pulse;
    a temporary memory for sampling input digital data in response to the sampling pulse and for temporarily holding the sampled data;
    an address counter advancing by one upon each occurrence of the sampling pulse, for generating an address signal;
    a data memory addressed by the address signal from the address counter, for writing at the specified address the data held in the temporary memory, said data memory being divided into a plurality of storage areas;
    a store-number register for storing and outputting at least one store number indicating the number of data that can be stored in each of said plurality of storage areas of said data memory;
    a store-number counter supplied with the respective store number output from the store-number register, for counting the sampling pulses and for generating a respective output signal when the count corresponds to the store number;
    a trigger word register for storing and outputting a plurality of trigger words respectively corresponding to the storage areas of the data memory;
    a trigger word detector for comparing the data held by the temporary memory and the respective trigger word output from the trigger word register and, when detecting coincidence therebetween, for generating a coincidence signal;
    a delay means for delaying the coincidence signal from the trigger word detector for a predetermined period of time, and for generating a corresponding stop signal;
    a leading address generator supplied with each respective store number from the store-number register, for generating, when supplied with the stop signal from the delay means, a leading address of the respective storage area of the data memory to be accessed next, and for holding and outputting the leading address of the currently accessed storage area of the data memory until supplied with the stop signal;
    means for presetting, by the output signal from the store-number counter, the respective leading address held in the leading address generator into the address counter and for presetting in the address counter, responsive to the stop signal from the delay means, the next leading address generated in the leading address generator; and
    a trigger word select means for selecting the respective trigger word for output from the trigger word register upon each occurrence of the stop signal from the delay means.

2. A logic analyzer according to claim 1 wherein a plurality of store numbers are stored in the store-number register, and which includes a store-number select means for selecting one of the store numbers for output upon each occurrence of the stop signal from the delay means.

3. A logic analyzer according to claim 2, wherein the delay means includes a delay register for storing delay data respectively corresponding to a plurality of a delay times, and a delay time select means for selecting, upon each occurrence of the stop signal from the delay means, one of the delay data for output to the delay means to cause the coincidence signal to be delayed for a predetermined period of time.

4. A logic analyzer according to claim 3 wherein the trigger word select means selects a different trigger word for each selection, the store-number select means selects a different store number for each selection and the delay time select means selects a different delay data for each selection.

5. A logic analyzer according to claim 1 which further includes a delay register for storing delay data respectively corresponding to a plurality of delay times, and a delay time select means for selecting, upon each occurence of the stop signal from the delay means, one of the delay data for output to the delay means to cause the coincidence signal to be delayed for a predetermined period of time.

6. A logic analyzer according to any one of claims 1 to 5 wherein the store-number counter is a presettable counter and presets therein the output of the store-number register by the stop signal from the delay means and the count-up signal from the store-number counter.

7. A logic analyzer according to any one of claims 1 to 5, comprising a latch circuit and an adder, wherein the leading address generator adds the output of the store-number register and the output of the latch circuit by said adder, latches the adder output in the latch circuit by the stop signal from the delay means, and outputs it as the leading address of the storage area to be accessed next.

8. A logic analyzer according to any one of claims 1 to 5, comprising a control unit for selectively reading out from each said address of the data memory said data written therein and for displaying the read-out data on a display.

9. A logic analyzer according to claim 8 wherein the control unit includes means for processing the read-out data and for supplying a corresponding output to the display for said displaying.

* * * * *

UNITED STATES PATENT AND TRADEMARK OFFICE
CERTIFICATE OF CORRECTION

PATENT NO. : 4,654,848

DATED : March 31, 1987

INVENTOR(S) : Noguchi

It is certified that error appears in the above-identified patent and that said Letters Patent is hereby corrected as shown below:

Col. 8, line 60, delete "attracting attention" and insert --to which attention is directed--;

line 61, "ogic" should be --logic--.

Col. 9, line 3, "p3" should be --P3--.

Signed and Sealed this

Twenty-ninth Day of September, 1987

Attest:

DONALD J. QUIGG

Attesting Officer     Commissioner of Patents and Trademarks